US010026735B2

(12) United States Patent
Zhao et al.

(10) Patent No.: US 10,026,735 B2
(45) Date of Patent: Jul. 17, 2018

(54) DECOUPLING CAPACITOR WITH METAL PROGRAMMABLE KNEE FREQUENCY

(71) Applicant: QUALCOMM Incorporated, San Diego, CA (US)

(72) Inventors: Andi Zhao, San Diego, CA (US); Ramaprasath Vilangudipitchai, San Diego, CA (US); Dorav Kumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/360,777

(22) Filed: Nov. 23, 2016

(65) Prior Publication Data

US 2018/0145071 A1    May 24, 2018

(51) Int. Cl.
| | |
|---|---|
| H01L 23/522 | (2006.01) |
| H01L 27/088 | (2006.01) |
| H01L 23/528 | (2006.01) |
| H01L 27/02 | (2006.01) |
| H03K 17/16 | (2006.01) |

(52) U.S. Cl.
CPC .......... *H01L 27/088* (2013.01); *H01L 23/528* (2013.01); *H01L 23/5222* (2013.01); *H01L 27/0207* (2013.01); *H03K 17/162* (2013.01)

(58) Field of Classification Search
CPC . H01L 27/088; H01L 23/5222; H01L 23/528; H01L 27/0207; H01L 23/5223; H03K 17/162
See application file for complete search history.

(56) References Cited

U.S. PATENT DOCUMENTS

| | | | |
|---|---|---|---|
| 6,057,729 A | * | 5/2000 | Nomura .................. G06F 1/305 |
| | | | 257/E27.046 |
| 6,608,365 B1 | | 8/2003 | Li et al. |
| 7,508,696 B2 | | 3/2009 | Komaki |
| 8,134,824 B2 | | 3/2012 | Frederick, Jr. et al. |

(Continued)

OTHER PUBLICATIONS

Charania T., et al., "Analysis and Design of On-Chip Decoupling Capacitors", IEEE Transactions on Very Large Scale Integration Systems (VLSI), IEEE Service Center, Piscataway, NJ, USA, vol. 21, No. 4, Apr. 2013, pp. 648-658, XP011497827, ISSN: 1063-8210, DOI: 10.1109/TVLSI.2012.2198501.

(Continued)

*Primary Examiner* — Jung Kim
(74) *Attorney, Agent, or Firm* — Arent Fox, LLP

(57) ABSTRACT

A MOS IC includes pMOS transistors, each having a pMOS transistor drain, source, and gate. Each pMOS transistor gate extends in a first direction and is coupled to other pMOS transistor gates. Each pMOS transistor source/drain are coupled to a first voltage source. The MOS IC further includes a first metal interconnect extending over the pMOS transistors. The first metal interconnect has first and second ends. The first metal interconnect is coupled to each pMOS transistor gate and is coupled to a second voltage source less than the first voltage source. One of each pMOS transistor gate or the second voltage source is coupled to the first metal interconnect through at least one tap point located between the first and second ends. The pMOS transistors and the first metal interconnect function as a decoupling capacitor.

30 Claims, 9 Drawing Sheets

(56) References Cited

U.S. PATENT DOCUMENTS

| | | |
|---|---|---|
| 8,446,175 B2 | 5/2013 | Aton |
| 9,379,707 B2 | 6/2016 | Eimitsu et al. |
| 9,418,932 B1 | 8/2016 | Lim et al. |
| 2007/0170553 A1 | 7/2007 | Correale, Jr. et al. |
| 2011/0148466 A1* | 6/2011 | Aton .................. H01L 27/0207 |
| | | 326/103 |
| 2013/0248957 A1 | 9/2013 | Kito |
| 2015/0021676 A1 | 1/2015 | Chen et al. |
| 2015/0303246 A1 | 10/2015 | Shi et al. |

OTHER PUBLICATIONS

International Search Report and Written Opinion—PCT/US2017/054097—ISA/EPO—Dec. 11, 2017.

Larsson P., "Resonance and Damping in CMOS Circuits with On-Chip Decoupling Capacitance", IEEE Transaction on Circuits and Systems Part 1: Regular Papers, IEEE Service Center, New York, NY, US, vol. 45, No. 8, Aug. 1998, XP011011779, ISSN: 1057-7122, pp. 849-858.

* cited by examiner

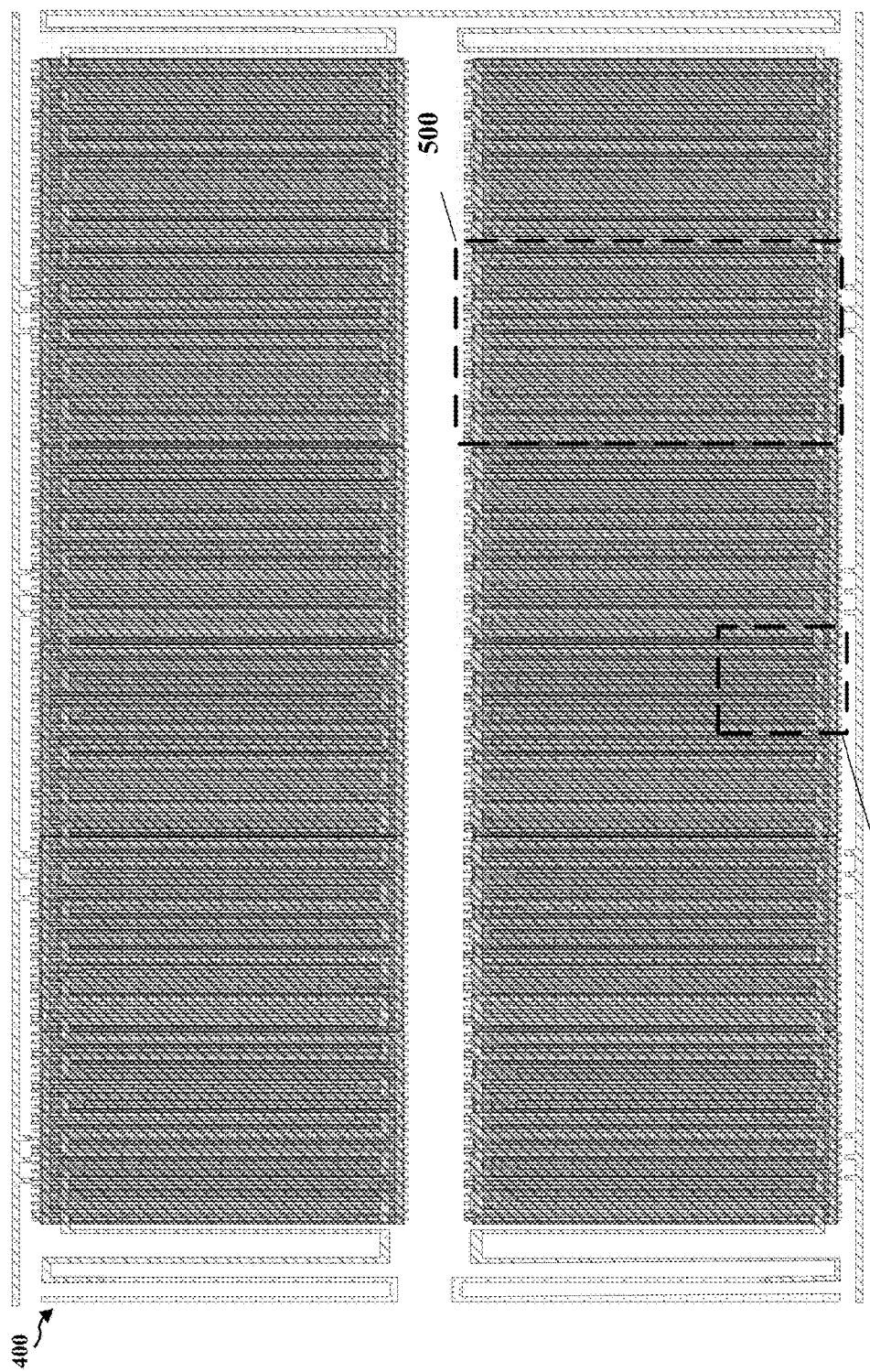

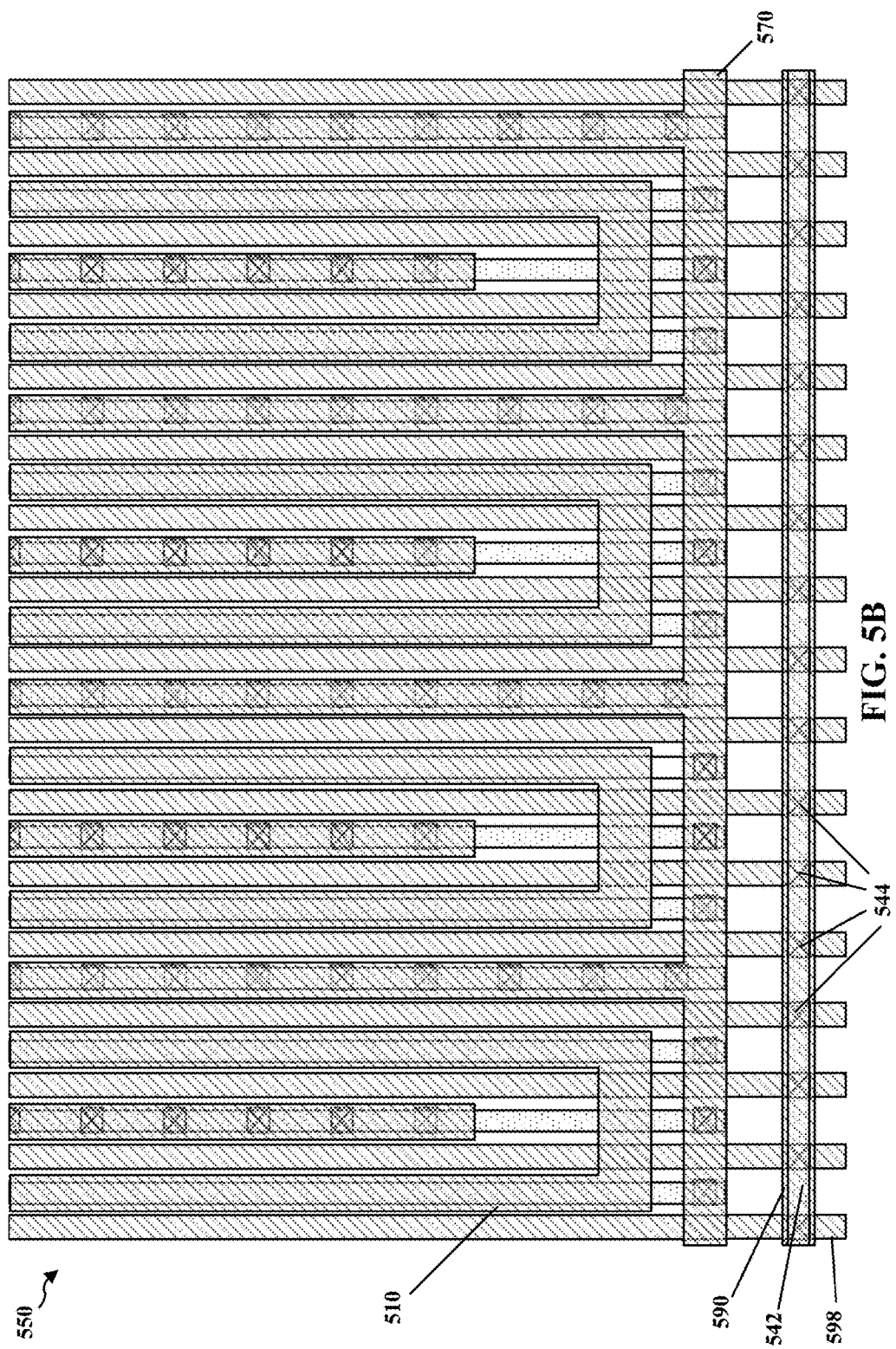

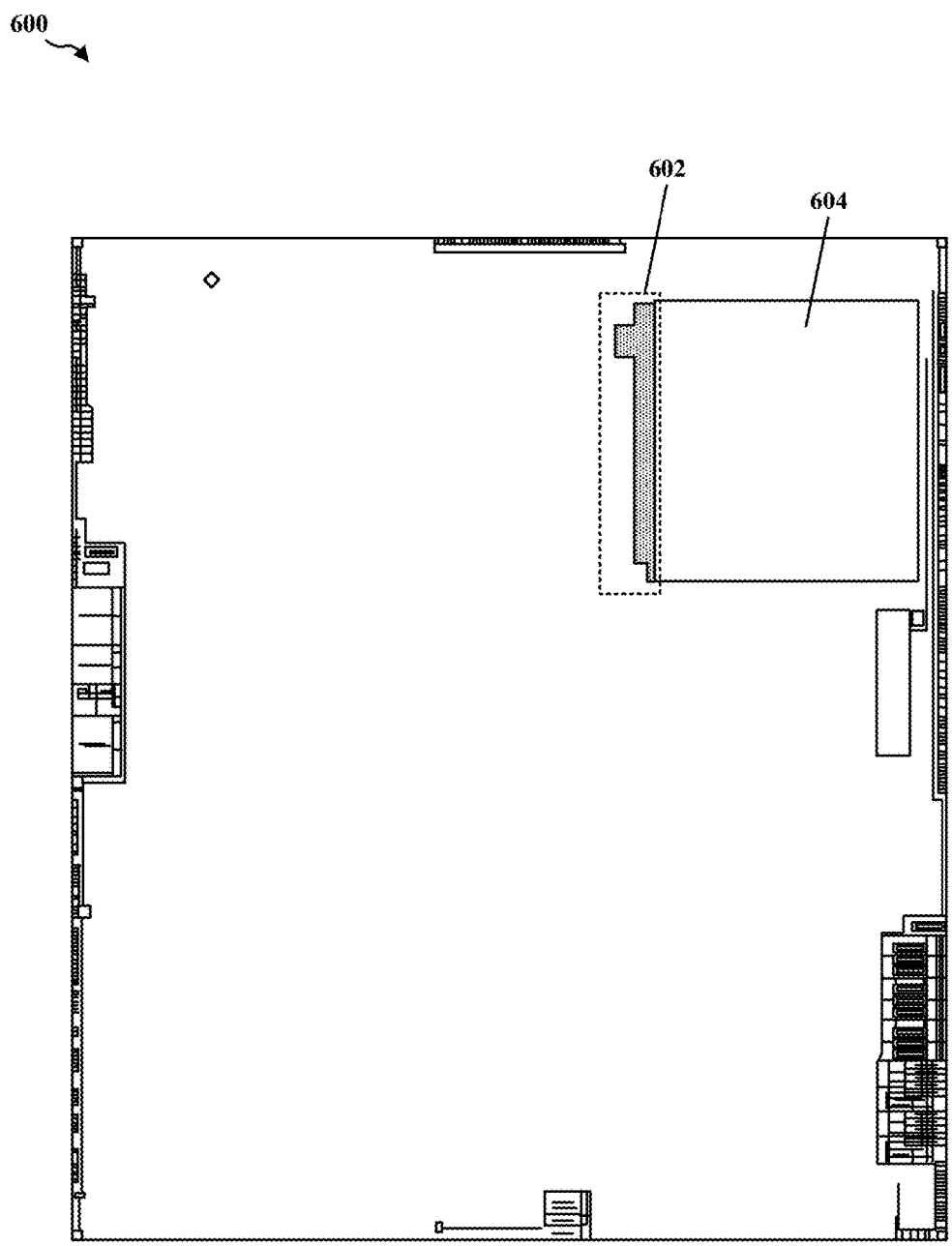
FIG. 6

DECOUPLING CAPACITOR WITH METAL PROGRAMMABLE KNEE FREQUENCY

BACKGROUND

Field

The present disclosure relates generally to a standard cell architecture, and more particularly, to a decoupling capacitor with a metal programmable knee frequency.

Background

A standard cell device is an integrated circuit (IC) that implements digital logic. An application-specific IC (ASIC), such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or a fin FETs (FinFETs)) and connect the transistors into circuits.

A decoupling capacitor (also referred to as bypass capacitor) is used to decouple one part of an IC from another part of an IC. A decoupling capacitor reduces noise caused by circuit elements when such noise is shunted through the decoupling capacitor. Decoupling capacitors may be used to suppress noise from power supplies, switching subcircuits, or other circuit components that generate noise. There is currently a need for improvements in the design and the functionality of a decoupling capacitor.

SUMMARY

In an aspect of the disclosure, a metal oxide semiconductor (MOS) IC or a MOS device of the IC includes a first plurality of p-type MOS (pMOS) transistors. Each pMOS transistor has a pMOS transistor drain, a pMOS transistor source, and a pMOS transistor gate. Each pMOS transistor gate of the first plurality of pMOS transistors extends in a first direction and is coupled to other pMOS transistor gates of the first plurality of pMOS transistors. Each pMOS transistor source and each pMOS transistor drain of the first plurality of pMOS transistors are coupled to a first voltage source. The MOS IC or the MOS device of the IC further includes a first metal interconnect extending over the first plurality of pMOS transistors. The first metal interconnect has a first end and a second end. The first metal interconnect is coupled to each pMOS transistor gate of the first plurality of pMOS transistors and is coupled to a second voltage source less than the first voltage source. One of each pMOS transistor gate of the first plurality of pMOS transistors or the second voltage source is coupled to the first metal interconnect through at least one tap point located between the first end and the second end. The first plurality of pMOS transistors and the first metal interconnect function as a decoupling capacitor.

BRIEF DESCRIPTION OF THE DRAWINGS

FIG. 4 is a second diagram illustrating a plan view of a layout for an exemplary decoupling capacitor.

FIG. 5B is a diagram illustrating a close-up plan view of a second portion of the exemplary decoupling capacitor of FIG. 4.

FIG. 6 is a diagram illustrating a plan view of a location of the exemplary decoupling capacitors in an IC.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
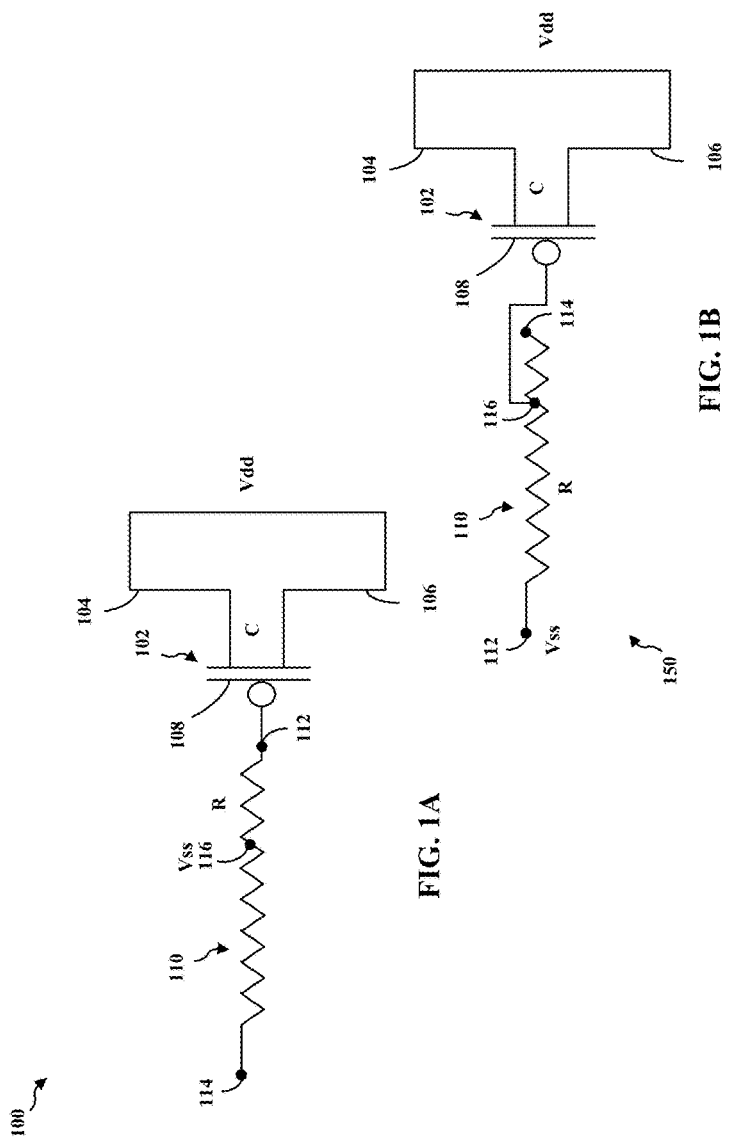
FIG. 1A is a diagram illustrating a circuit schematic for a first exemplary decoupling capacitor.
FIG. 1B is a diagram illustrating a circuit schematic for a second exemplary decoupling capacitor.

A decoupling capacitor (also referred to as bypass capacitor or damping decoupling capacitor) is used to decouple one part of an IC from another part of an IC. A decoupling capacitor reduces noise caused by circuit elements when such noise is shunted through the decoupling capacitor. Decoupling capacitors may be used to suppress noise from power supplies, switching subcircuits, or other circuit components that generate noise. FIGS. 1A, 1B infra illustrate circuit schematics for exemplary decoupling capacitors. FIGS. 2-7 infra illustrate/conceptually illustrate a layout for an exemplary decoupling capacitor/decoupling capacitor standard cell. The exemplary decoupling capacitor is configured for programming a knee frequency through changing a location of a tap point in the exemplary decoupling capacitor. The programming is performed by changing one or more masks during fabrication of the IC.

FIG. 1A is a diagram illustrating a circuit schematic for a first exemplary decoupling capacitor 100. FIG. 1B is a diagram illustrating a circuit schematic for a second exemplary decoupling capacitor 150. As illustrated in FIG. 1A, the decoupling capacitor 100 includes a pMOS transistor 102 and a resistor 110. The pMOS transistor 102 has a pMOS transistor source 104, a pMOS transistor drain 106, and a pMOS transistor gate 108. The pMOS transistor source 104 and the pMOS transistor drain 106 are connected to a first voltage source Vdd. A second voltage source Vss (Vss<Vdd; e.g., Vss is a ground voltage) is coupled to the pMOS transistor gate 108 through the resistor 110. A first end 112 of the resistor 110 is connected to the pMOS transistor gate 108. A tap point 116 of the resistor 110 is connected to the second voltage source Vss. The tap point 116 is between the first end 112 and a second end 114 of the resistor 110. The second end 114 of the resistor 110 may be left open/unconnected. A resistance R of the resistor 110 is programmed through selection of a location of the tap point 116. Accordingly, with a given capacitance C of the pMOS transistor 102, an RC of the decoupling capacitor 100 including the resistor 110 and pMOS transistor 102 may be controlled/programmed through selection of the location of the tap point 116. The location of the tap point 116 may be set by utilizing a particular set of masks during fabrication of the decoupling capacitor. As a knee frequency is a function of $\frac{1}{2}\pi RC$, the knee frequency of the decoupling capacitor may be programmed through selection of the location of the tap point 116.

While FIG. 1A illustrates the first end 112 of the resistor 110 connected to the pMOS transistor gate 108 and the tap point 116 connected to the second voltage source Vss, in another configuration as illustrated in FIG. 1B, the first end 112 of the resistor 110 may be connected to the second voltage source Vss and the tap point 116 may be connected to the pMOS transistor gate 108.

Figure 2:
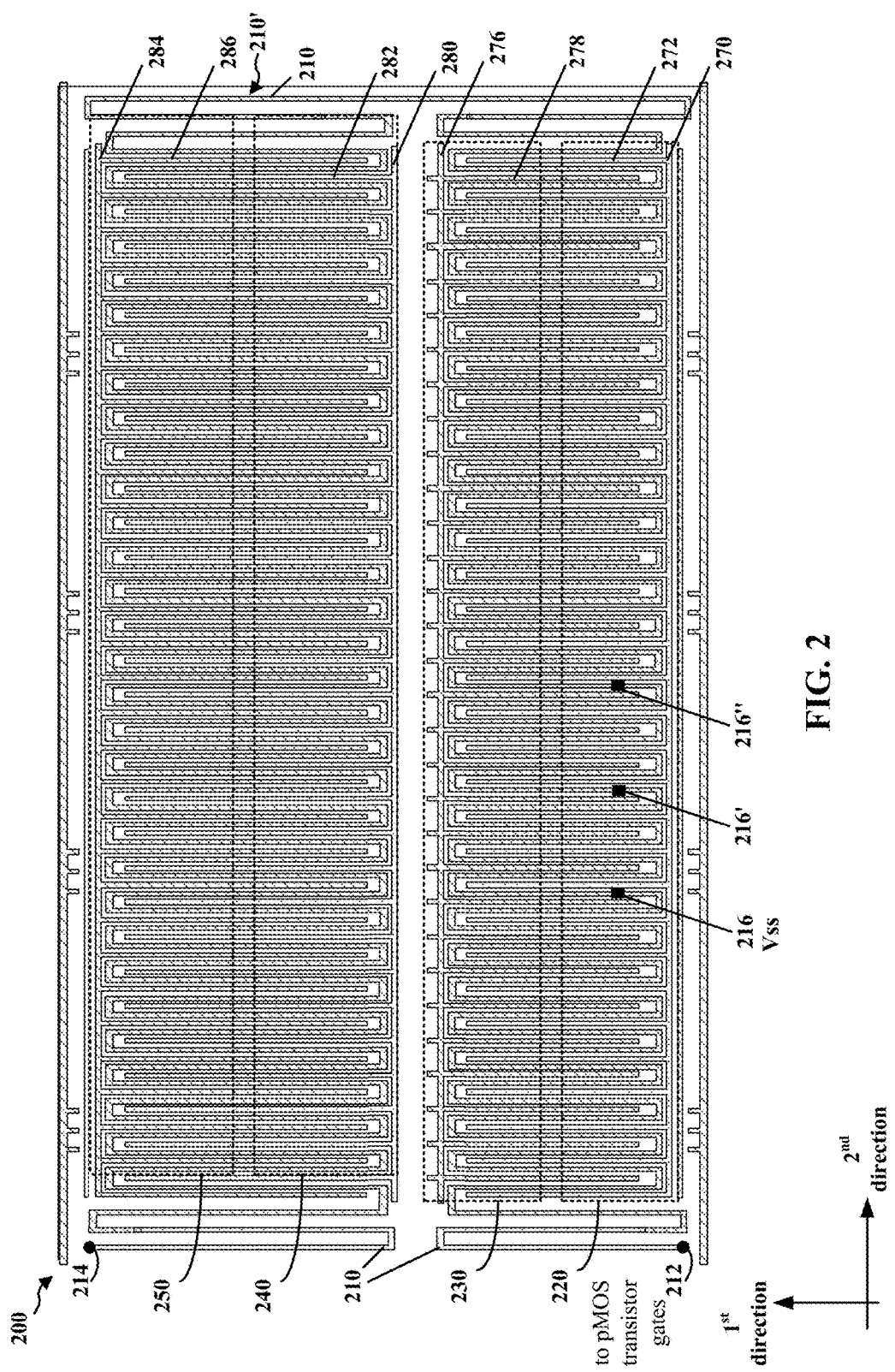
FIG. 2 is a first diagram illustrating a plan view of a layout for an exemplary decoupling capacitor.

FIG. 2 is a first diagram illustrating a plan view of a layout for an exemplary decoupling capacitor 200. The decoupling capacitor 200 illustrates a few of the design layers used to form the device on the substrate. Not all layers are illustrated. The design layers may be used to create masks for forming the device. The decoupling capacitor 200 may be within a standard cell. The decoupling capacitor 200 includes a first plurality of pMOS transistors 220, a second plurality of pMOS transistors 230, a third plurality of pMOS transistors 240, and a fourth plurality of pMOS transistors 250. Sources/drains of the first plurality of pMOS transistors 220 are connected together by a metal interconnect 270 that extends in the second direction orthogonal to the first direction. Sources/drains of the second plurality of pMOS transistors 230 are connected together by a metal interconnect 276 that extends in the second direction. Sources/drains of the third plurality of pMOS transistors 240 are connected together by a metal interconnect 280 that extends in the second direction. Sources/drains of the fourth plurality of pMOS transistors 250 are connected together by a metal interconnect 284 that extends in the second direction. Each of the metal interconnects 270, 276, 280, 284 are connected to a first voltage source Vdd, which thereby ties all drains/sources of the first, second, third, and fourth plurality of pMOS transistors 220, 230, 240, 250 to the first voltage source Vdd.

The metal interconnects 270, 276, 280, 284 may each include fingers 272, 278, 282, 286, respectively, that extend in the first direction. The fingers 272, 278, 282, 286 extend over the source/drain regions of the first, second, third, and fourth plurality of pMOS transistors 220, 230, 240, 250, and increase a capacitance of the decoupling capacitor 200. In a lower portion of the standard cell, a metal interconnect 210 interweaves in an "S" shape through the first and second plurality of pMOS transistors 220, 230, extends up to an upper portion of the standard cell (at 210'), and interweaves in an "S" shape through the third and fourth plurality of pMOS transistors 240, 250. The fingers 272, 278 extend between portions of the "S" shaped metal interconnect 210 in the lower portion of the standard cell, and the fingers 282, 286 extend between portions of the "S" shaped metal interconnect 210 in the upper portion of the standard cell. In a first configuration, the fingers 272, 278, 282, 286 extend over drain regions of the first, second, third, and fourth plurality of pMOS transistors 220, 230, 240, 250, and the metal interconnect 210 extends over source regions of the first, second, third, and fourth plurality of pMOS transistors 220, 230, 240, 250 as the metal interconnect 210 interweaves in substantially an "S" shape through the first, second, third, and fourth plurality of pMOS transistors 220, 230, 240, 250. In a second configuration, the fingers 272, 278, 282, 286 extend over source regions of the first, second, third, and fourth plurality of pMOS transistors 220, 230, 240, 250, and the metal interconnect 210 extends over drain regions of the first, second, third, and fourth plurality of pMOS transistors 220, 230, 240, 250 as the metal interconnect 210 interweaves in substantially an "S" shape through the first, second, third, and fourth plurality of pMOS transistors 220, 230, 240, 250. The metal interconnect 210 is connected to gates of the first, second, third, and fourth plurality of pMOS transistors 220, 230, 240, 250 at a first end 212. The metal interconnect 210 is connected to Vss at a tap point 216. The metal interconnect 210 has a second end 214 that may remain unconnected. The tap point 216 may be changed to different locations, such as 216' or 216" in order to adjust a resistance R input to the pMOS transistor gates, and thereby to adjust a knee frequency of the decoupling capacitor 200. For example, with a tap point at 216, the resistance may be $R_1$ and the decoupling capacitor may have a knee frequency of $f_{knee1}$ (e.g., $R_1$=1.77kΩ, $f_{knee1}$=75 MHz). For another example, with a tap point at 216', the resistance may be $R_2$ (where $R_2<R_1$) and the decoupling capacitor may have a knee frequency of $f_{knee2}$ (where $f_{knee2}>f_{knee1}$) (e.g., $R_2$=1.36kΩ, $f_{knee2}$=100 MHz). For another example, with a tap point at 216", the resistance may be $R_3$ (where $R_3<R_2$) and the decoupling capacitor may have a knee frequency of $f_{knee3}$ (where $f_{knee3}>f_{knee2}$) (e.g., $R_3$=1.08kΩ, $f_{knee3}$=125 MHz). The knee frequency may be set to correspond to a harmonic/self-resonant frequency (SRF), where $$SRF = \frac{1}{2}\pi\sqrt{LC}$$

and L is an inductance of the decoupling capacitor. Matching the knee frequency to the SRF may dampen the impedance pole/peak at the SRF of the decoupling capacitor.

As illustrated in FIG. 2, a lower portion of the standard cell includes the first plurality of pMOS transistors 220 and the second plurality of pMOS transistors 230, and an upper portion of the standard cell includes the third plurality of pMOS transistors 240 and the fourth plurality of pMOS transistors 240. The upper portion of the standard cell allows for the metal interconnect 210 to be longer, which provides for a larger range for programming the knee frequency. In a first configuration, a decoupling capacitor standard cell includes just the illustrated lower portion. In a second configuration, as illustrated in FIG. 2, a decoupling capacitor standard cell includes both the illustrated lower and upper portions.

Figure 3:
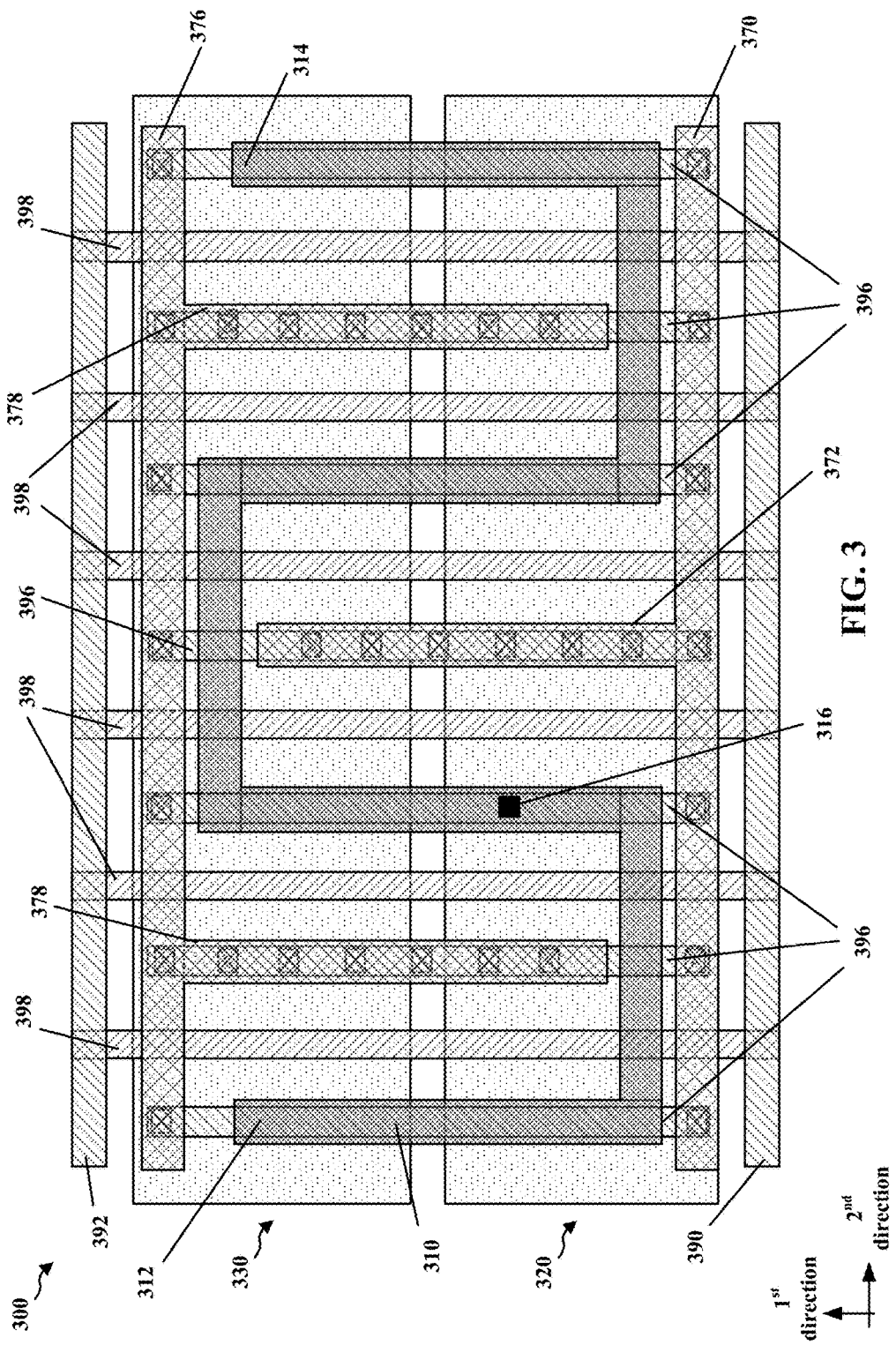
FIG. 3 is a diagram conceptually illustrating a plan view of a layout for an exemplary decoupling capacitor.

FIG. 3 is a diagram conceptually illustrating a plan view of a layout for an exemplary decoupling capacitor 300. The decoupling capacitor 300 includes a first plurality of pMOS transistors 320 and a second plurality of pMOS transistors 330. Gates 398 of the pMOS transistors 320, 330 extend in a first direction. Each gate 398 is formed by one gate interconnect 398 that is shared by a pair of pMOS transistors, one pMOS transistor of the pMOS transistors 320 and one pMOS transistor of the pMOS transistors 330. The gates 398 of the pMOS transistors 320 are coupled together by a contact B (CB) interconnect 390 (also referred to as a metal POLY (MP) interconnect) extending in a second direction orthogonal to the first direction. The gates 398 of the pMOS transistors 330 are coupled together by a CB interconnect 392 extending in the second direction. The source/drains of the pMOS transistors 320, 330 are each contacted by a contact A (CA) interconnect 396 (also referred to as a metal diffusion (MD) interconnect) extending in the first direction. The sources/drains of the pMOS transistors 320 are coupled together with a metal interconnect 370 that is connected by via to the CA interconnects 396. The metal interconnect 370 extends in the second direction. The sources/drains of the pMOS transistors 330 are coupled together with a metal interconnect 376 that is connected by via to the CA interconnects 396. The metal interconnect 376 extends in the second direction. The metal interconnects 370, 376 are coupled to a first voltage source Vdd. A metal interconnect 310 extends over the pMOS transistors 320, 330. The metal interconnect 310 has a first end 312 and a second end 314. As discussed supra (see FIG. 1A), the first end 312 may be connected to the gates 398 of the pMOS transistors 320, 330 by connecting the first end 312 to the CB interconnects 390, 392, and a tap point 316 between the first end 312 and the second end 314 may be connected to a second voltage source Vss. Alternatively (see FIG. 1B), the first end 312 may be connected to a second voltage source Vss, and the tap point 316 between the first end 312 and the second end 314 may be connected to the gates 398 of the pMOS transistors 320, 330 by connecting the tap point 316 to the CB interconnects 390, 392. The second end 314 may remain unconnected.

As illustrated in FIG. 3, the metal interconnect 310 may extend in substantially an "S" shape over the pMOS transistors 320, 330 and between the metal interconnects 370, 376. The metal interconnects 370, 376, 310 may each be formed by a different mask, and therefore three different masks may be required during fabrication to form the three metal interconnects 370, 376, 310. Further, the metal interconnects 370, 376, 310 may be on a metal one (M1) layer. As illustrated in FIG. 3, the metal interconnect 370 includes fingers 372 that extend in the first direction, and the metal interconnect 376 includes fingers 378 that extend in the first direction. The fingers 372, 378 contact the corresponding CA interconnects through vias. The fingers 372, 378 extend between portions of the "S" shaped metal interconnect 310. The fingers 372, 378 increase a capacitance of the decoupling capacitor. As the metal interconnect 310 extends in the first direction in every other source/drain region and in the second direction in every other drain/source region (creating an "S" shape), the metal interconnect 310 may interweave in an "S" shape over the pMOS transistors 320, 330 such that the metal interconnect 310 extends in the first direction over just the drain regions of the pMOS transistors 320, 330 and in the second direction over just the source regions of the pMOS transistors 320, 330, or such that the metal interconnect 310 extends in the first direction over just the source regions of the pMOS transistors 320, 330 and in the second direction over just the drain regions of the pMOS transistors 320, 330. As such, when the metal interconnect 310 extends in the first direction over the source regions of the pMOS transistors 320, 330 and in the second direction over the drain regions of the pMOS transistors 320, 330, the fingers 372, 378 extend in the first direction over the drain regions of the pMOS transistors 320, 330. Further, when the metal interconnect 310 extends in the first direction over the drain regions of the pMOS transistors 320, 330 and in the second direction over the source regions of the pMOS transistors 320, 330, the fingers 372, 378 extend in the first direction over the source regions of the pMOS transistors 320, 330.

FIG. 4 is a second diagram illustrating a plan view of a layout for an exemplary decoupling capacitor 400. FIG. 4 is similar to FIG. 2, but also illustrates gate interconnects. Close-up views are indicated by reference 500 (see FIG. 5A) and reference 550 (see FIG. 5B).

Figure 5A:
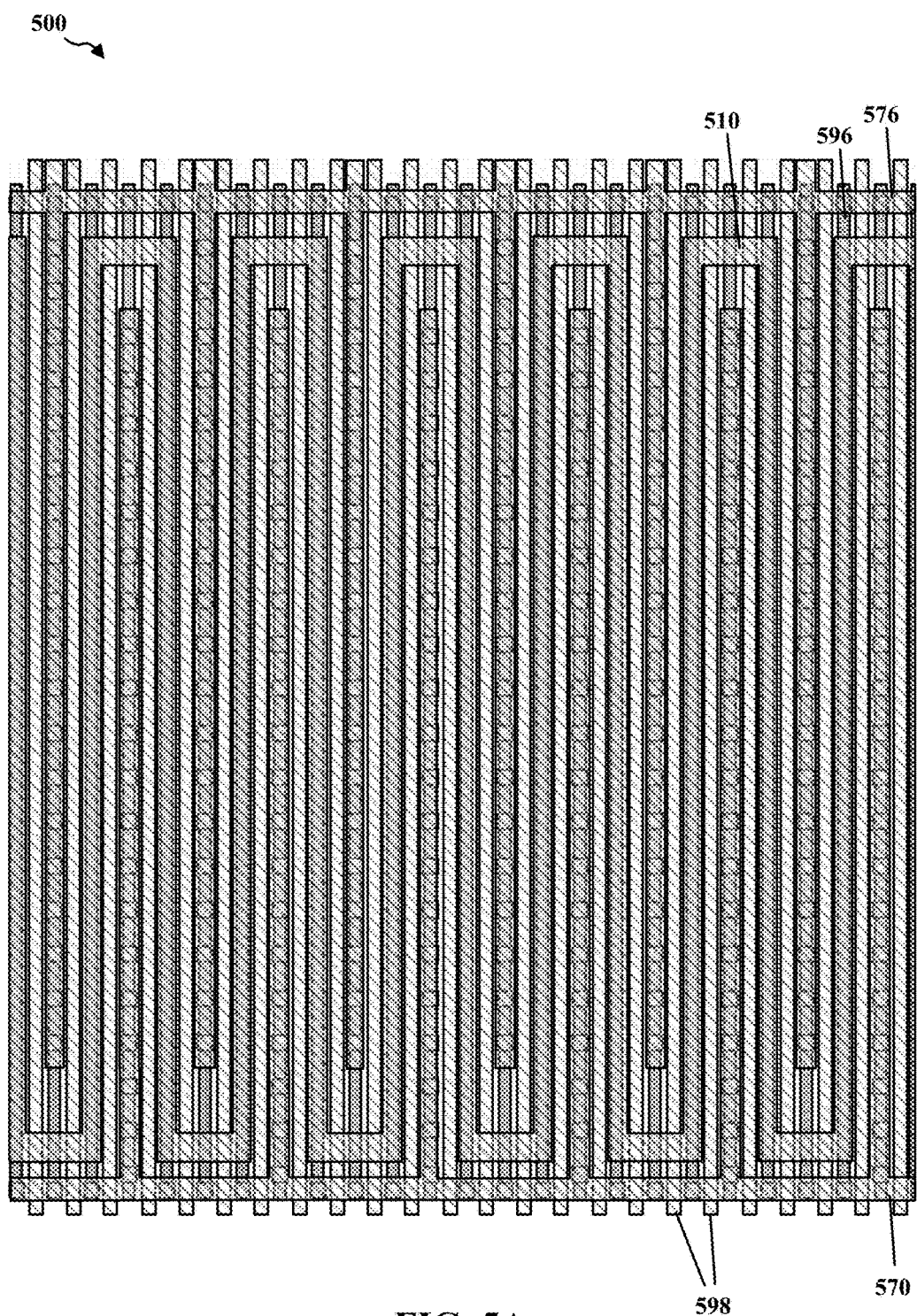
FIG. 5A is a diagram illustrating a close-up plan view of a first portion of the exemplary decoupling capacitor of FIG. 4.

FIG. 5A is a diagram illustrating a close-up plan view of a first portion 500 of the exemplary decoupling capacitor of FIG. 4. FIG. 5B is a diagram illustrating a close-up plan view of a second portion 550 of the exemplary decoupling capacitor of FIG. 4. FIGS. 5A, 5B illustrate a few of the design layers used to form the device on the substrate. Not all layers are illustrated. The design layers may be used to create masks for forming the device. The sources/drains for the pMOS transistors are contacted by CA interconnects 596. The metal interconnects 570, 576 are connected to a voltage source Vdd and are connected through vias to the CA interconnects 596 to connect together the source/drains of the pMOS transistors and to tie the sources/drains of the pMOS transistors to the voltage source Vdd. The gate interconnects 598 are connected together by a CB interconnect 590. The metal interconnect 510 extends over the pMOS transistors and between the metal interconnects 570, 576 in substantially an "S" shape. As discussed supra, the metal interconnect 510 may be coupled to the gates 598 of the pMOS transistors at a first end, and to a voltage source Vss at a tap point. FIG. 5B also illustrates a metal interconnect 542 that extends over the CB interconnect 590 and is connected to the CP interconnect 590 through multiple vias 544. The metal interconnect 542 (which may be an M1 layer interconnect) may be coupled to the first end of the metal interconnect 510 to thereby couple the CB interconnect 590 to the first end of the metal interconnect 510.

FIG. 6 is a diagram illustrating a plan view of a location of the exemplary decoupling capacitors in an IC 600. As illustrated in FIG. 6, the aforementioned decoupling capacitors may be located in a gutter region 602 adjacent to and at an edge of a processor, controller, central processing unit (CPU), or other high performance component 604. The gutter region is located between two IC components, one of which may be the processor, controller, CPU, or other high performance component 604. The bank of decoupling capacitors in the gutter region 602 reduces noise caused by the processor, controller, CPU, or other high performance component 604, as such noise is shunted through the bank of decoupling capacitors in the gutter region 602.

Figure 7:
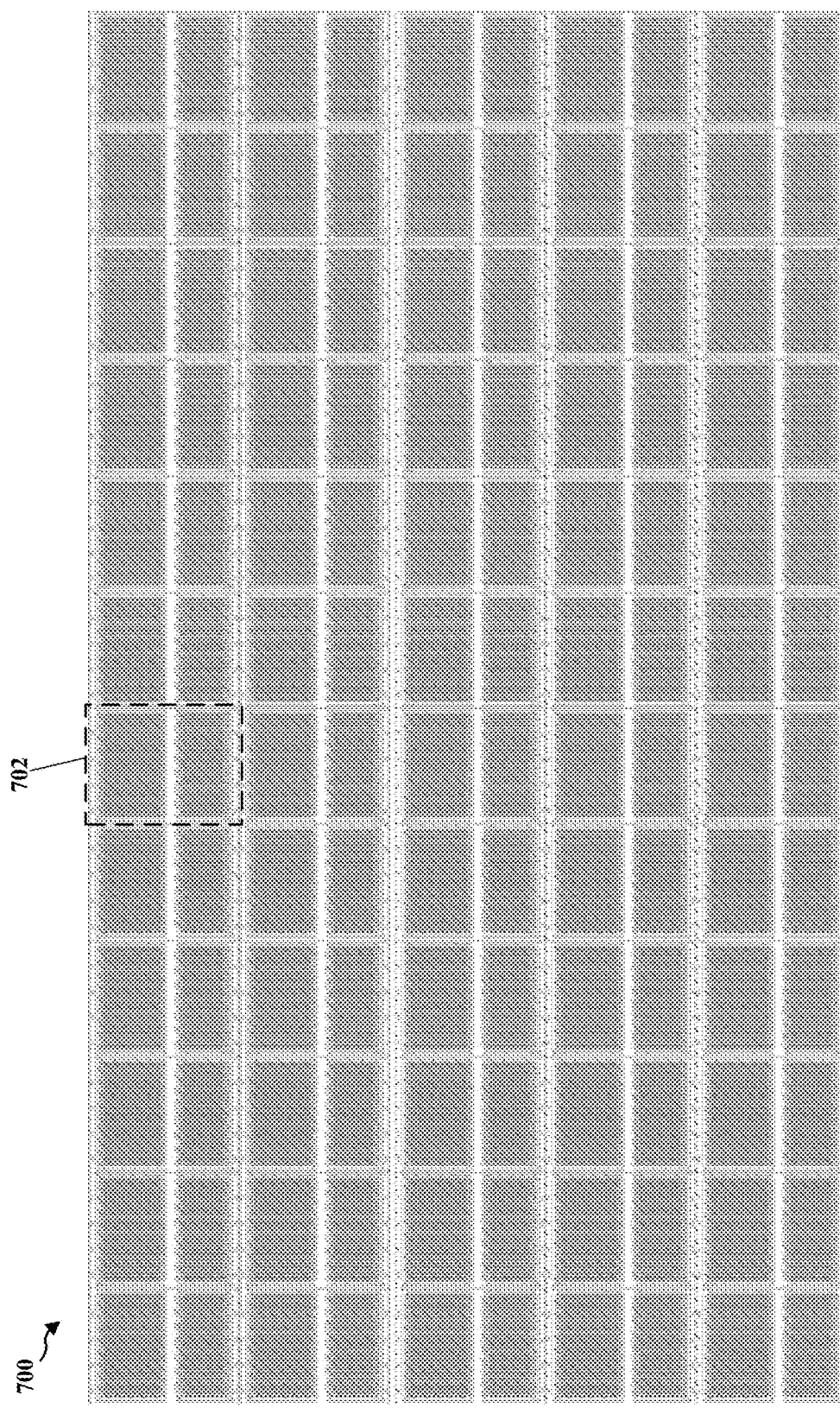
FIG. 7 is a diagram illustrating a plan view of a bank of decoupling capacitor standard cells.

FIG. 7 is a diagram illustrating a plan view of a bank of decoupling capacitor standard cells 700. FIG. 7 illustrates a close-up plan view of a portion of the decoupling capacitor standard cells of FIG. 6. As illustrated in FIG. 7, the decoupling capacitor standard cells 702 may be in a bank of standard cells, including multiple columns and rows of standard cells. The decoupling capacitor standard cell 702 is as illustrated by 400 in FIG. 4.

Referring again to FIGS. 1-7, a MOS IC 100, 200, 300, 400, 500, 550 includes a first plurality of pMOS transistors 220, 320. Each pMOS transistor of the first plurality of pMOS transistors 220, 320 has a pMOS transistor drain, a pMOS transistor source, and a pMOS transistor gate 398, 598. Each pMOS transistor gate 398, 598 of the first plurality of pMOS transistors 220, 320 extends in a first direction and is coupled to other pMOS transistor gates 398, 598 of the first plurality of pMOS transistors 220, 320. Each pMOS transistor source and each pMOS transistor drain of the first plurality of pMOS transistors 220, 320 is coupled to a first voltage source Vdd. The MOS IC 100, 200, 300, 400, 500, 550 further includes a first metal interconnect 110, 210, 310, 510 extending over the first plurality of pMOS transistors 220, 320. The first metal interconnect 110, 210, 310, 510 has a first end 112, 212, 312 and a second end 114, 214, 314. The first metal interconnect 110, 210, 310, 510 is coupled to each pMOS transistor gate 398, 598 of the first plurality of pMOS transistors 220, 320 and is coupled to a second voltage source Vss less than the first voltage source Vdd. One of each pMOS transistor gate 398, 598 of the first plurality of pMOS transistors 220, 320 or the second voltage source Vss is coupled to the first metal interconnect 110, 210, 310, 510 through at least one tap point 116, 216, 316 located between the first end 112, 212, 312 and the second end 114, 214, 314. The first plurality of pMOS transistors 220, 320 and the first metal interconnect 110, 210, 310, 510 function as a decoupling capacitor. In one configuration, the first plurality of pMOS transistors 220, 320 and the first metal interconnect 110, 210, 310, 510 function as a decoupling capacitor having a knee frequency that is a function of the at least one tap point 116, 216, 316. In one configuration, the first metal interconnect 110, 210, 310, 510 extends in substantially an "S" shape over the first plurality of pMOS transistors 220, 320.

In one configuration, the MOS IC 100, 200, 300, 400, 500, 550 further includes a second plurality of pMOS transistors 230, 330. Each pMOS transistor of the second plurality of pMOS transistors 230, 330 has a pMOS transistor drain, a pMOS transistor source, and a pMOS transistor gate 398, 598. Each pMOS transistor gate 398, 598 of the second plurality of pMOS transistors 230, 330 extends in the first direction and is coupled together. Each pMOS transistor source and each pMOS transistor drain of the second plurality of pMOS transistors 230, 330 is coupled to the first voltage source Vdd. Each pMOS transistor gate 398, 598 of the second plurality of pMOS transistors 230, 330 and a corresponding pMOS transistor gate 398, 598 of the first plurality of pMOS transistors 220, 320 are formed through a gate interconnect 398, 598 extending in the first direction.

In one configuration, the first metal interconnect 110, 210, 310, 510 is coupled to each pMOS transistor gate 398, 598 of the first and second plurality of pMOS transistors 220, 320, 230, 330 at one of the first end 112, 212, 312 or the at least one tap point 116, 216, 316 between the first end 112, 212, 312 and the second end 114, 214, 314. The first metal interconnect 110, 210, 310, 510 is coupled to the second voltage source Vss at an other of the first end 112, 212, 312 or the at least one tap point 116, 216, 316 between the first end 112, 212, 312 and the second end 114, 214, 314, and the first metal interconnect 110, 210, 310, 510 extends over the second plurality of pMOS transistors 230, 330.

In one configuration, the first end 112, 212, 312 is coupled to the pMOS transistor gates 398, 598 of the first plurality of pMOS transistors 220, 320 and the second plurality of pMOS transistors 230, 330, and the at least one tap point 116, 216, 316 is coupled to the second voltage source Vss. In one configuration, the second end 114, 214, 314 is unconnected.

In one configuration, the MOS IC 100, 200, 300, 400, 500, 550 further includes a third plurality of pMOS transistors 240. Each of the third plurality of pMOS transistors 240 has a pMOS transistor drain, a pMOS transistor source, and a pMOS transistor gate 398, 598. Each pMOS transistor gate 398, 598 of the third plurality of pMOS transistors 240 extends in the first direction and is coupled to other pMOS transistor gates 398, 598 of the third plurality of pMOS transistors 240. Each pMOS transistor source and each pMOS transistor drain of the third plurality of pMOS transistors 240 is coupled to the first voltage source Vdd. In such a configuration, the MOS IC 100, 200, 300, 400, 500, 550 further includes a fourth plurality of pMOS transistors 250. Each of the fourth plurality of pMOS transistors 250 has a pMOS transistor drain, a pMOS transistor source, and a pMOS transistor gate 398, 598. Each pMOS transistor gate 398, 598 of the fourth plurality of pMOS transistors 250 extends in the first direction and is coupled together. Each pMOS transistor source and each pMOS transistor drain of the fourth plurality of pMOS transistors 250 is coupled to the first voltage source Vdd. Each pMOS transistor gate 398, 598 of the fourth plurality of pMOS transistors 250 and a corresponding pMOS transistor gate 398, 598 of the third plurality of pMOS transistors 240 is formed through a gate interconnect 398, 598 extending in the first direction. In one configuration, the first metal interconnect 110, 210, 310, 510 is coupled to each pMOS transistor gate 398, 598 of the third and fourth plurality of pMOS transistors 240, 250 at one of the first end 112, 212, 312 or the at least one tap point 116, 216, 316 between the first end 112, 212, 312 and the second end 114, 214, 314, and the first metal interconnect 110, 210, 310, 510 extends over the third and fourth plurality of pMOS transistors 240, 250.

In one configuration, the first metal interconnect 110, 210, 310, 510 extends in substantially an "S" shape over the first plurality of pMOS transistors 220, 320 and the second plurality of pMOS transistors 230, 330.

In one configuration, the MOS IC 100, 200, 300, 400, 500, 550 further includes a second metal interconnect 270, 370, 570 extending in a second direction orthogonal to the first direction. The second metal interconnect 270, 370, 570 is coupled to each pMOS transistor source and each pMOS transistor drain of the first plurality of pMOS transistors 220, 320 and is coupled to the first voltage source Vdd. In such a configuration, the MOS IC 100, 200, 300, 400, 500, 550 further includes a third metal interconnect 276, 376, 576 extending in the second direction. The third metal interconnect 276, 376, 576 is coupled to each pMOS transistor source and each pMOS transistor drain of the second plurality of pMOS transistors 230, 330 and is coupled to the first voltage source Vdd. In one configuration, the first metal interconnect 110, 210, 310, 510, the second metal interconnect 270, 370, 570, and the third metal interconnect 276, 376, 576 are each formed by a different mask and are located on an M1 layer. In one configuration, the first metal interconnect 110, 210, 310, 510 extends in substantially an "S" shape over the first plurality of pMOS transistors 220, 320 and the second plurality of pMOS transistors 230, 330 and between the second metal interconnect 270, 370, 570 and the third metal interconnect 276, 376, 576. In one configuration, the second metal interconnect 270, 370, 570 and the third metal interconnect 276, 376, 576 include portions 272, 372, 278, 378 that extend in the first direction and that extend between portions of the substantially "S" shaped first metal interconnect 110, 210, 310, 510.

In one configuration, the first metal interconnect 110, 210, 310, 510 extends in one of the first direction or a second direction over the pMOS transistor sources of the first plurality of pMOS transistors 220, 320 and the second plurality of pMOS transistors 230, 330, and in an other of the first direction or the second direction over the pMOS transistor drains of the first plurality of pMOS transistors 220, 320 and the second plurality of pMOS transistors 230, 330, where the second direction is orthogonal to the first direction. In one configuration, the first metal interconnect 110, 210, 310, 510 extends in the first direction over the pMOS transistor sources of the first plurality of pMOS transistors 220, 320 and the second plurality of pMOS transistors 230, 330, and in the second direction over the pMOS transistor drains of the first plurality of pMOS transistors 220, 320 and the second plurality of pMOS transistors 230, 330.

In one configuration, the first plurality of pMOS transistors 220, 320 and the first metal interconnect 110, 210, 310, 510 are located in a gutter region 602 adjacent to one of a processor 604 or a controller 604 of the MOS IC 100, 200, 300, 400, 500, 550.

Figure 8:
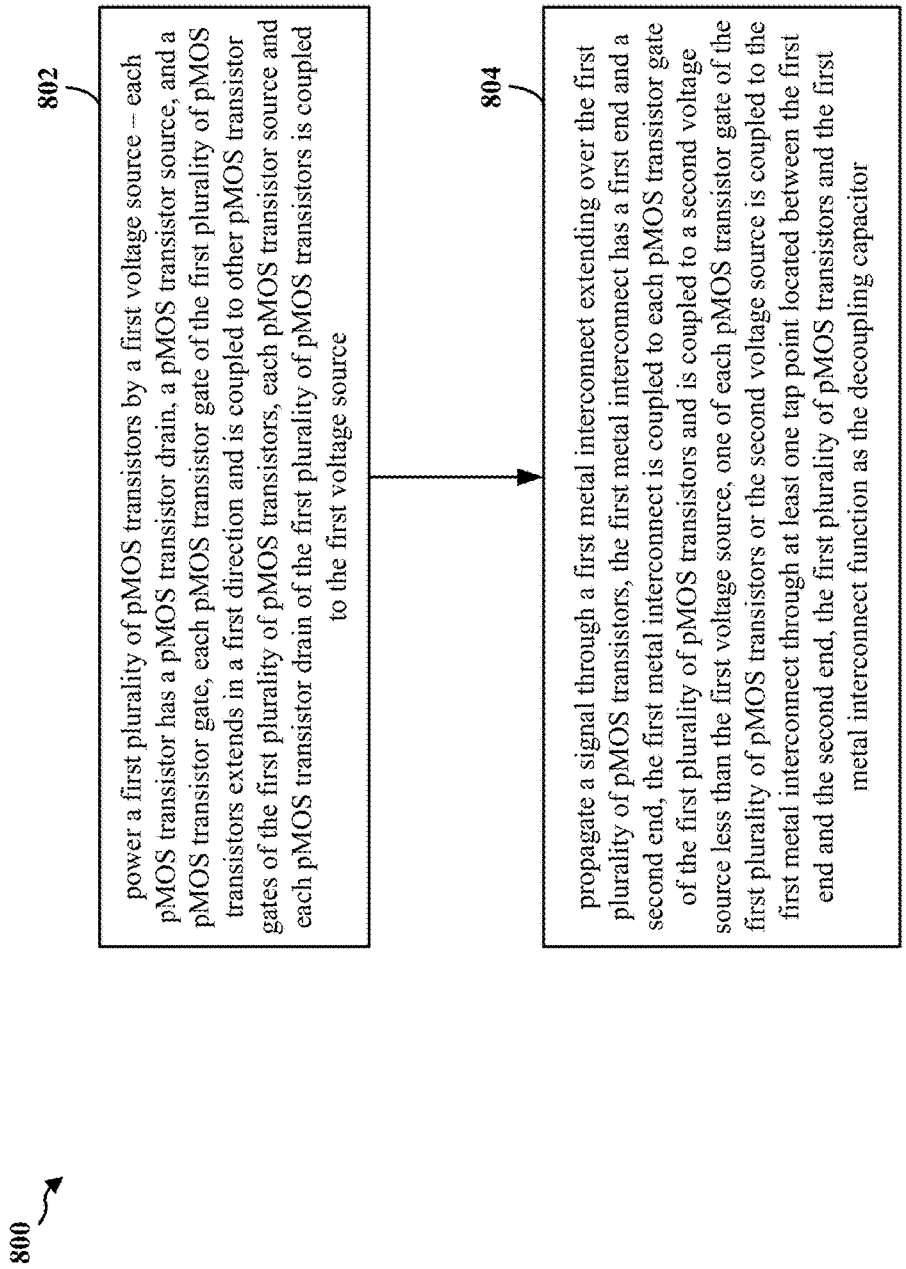
FIG. 8 is a diagram illustrating a method of operation a MOS IC decoupling capacitor.

FIG. 8 is a diagram 800 illustrating a method of operation a MOS IC decoupling capacitor. As illustrated in FIG. 8, at 802, a first plurality of pMOS transistors 220, 320 is powered by a first voltage source Vdd. Each pMOS transistor of the first plurality of pMOS transistors 220, 320 has a pMOS transistor drain, a pMOS transistor source, and a pMOS transistor gate 398, 598. Each pMOS transistor gate 398, 598 of the first plurality of pMOS transistors 220, 320 extends in a first direction and is coupled to other pMOS transistor gates 398, 598 of the first plurality of pMOS transistors 220, 320. Each pMOS transistor source and each pMOS transistor drain of the first plurality of pMOS transistors 220, 320 is coupled to the first voltage source Vdd. At 804, a signal (e.g., from a second voltage source Vss) is propagated through a first metal interconnect 110, 210, 310, 510 extending over the first plurality of pMOS transistors 220, 320. The first metal interconnect 110, 210, 310, 510 has a first end 112, 212, 312 and a second end 114, 214, 314. The first metal interconnect 110, 210, 310, 510 is coupled to each pMOS transistor gate 398, 598 of the first plurality of pMOS transistors 220, 320 and is coupled to the second voltage source Vss less than the first voltage source Vdd. One of each pMOS transistor gate 398, 598 of the first plurality of pMOS transistors 220, 320 or the second voltage source Vss is coupled to the first metal interconnect 110, 210, 310, 510 through at least one tap point 116, 216, 316 located between the first end 112, 212, 312 and the second end 114, 214, 314. The first plurality of pMOS transistors 220, 320 and the first metal interconnect 110, 210, 310, 510 function as a decoupling capacitor. In one configuration, the first plurality of pMOS transistors 220, 320 and the first metal interconnect 110, 210, 310, 510 function as a decoupling capacitor having a knee frequency that is a function of the at least one tap point 116, 216, 316. In one configuration, the first metal interconnect 110, 210, 310, 510 extends in substantially an "S" shape over the first plurality of pMOS transistors 220, 320.

In one configuration, a second plurality of pMOS transistors 230, 330 is powered by the first voltage source Vdd. Each pMOS transistor of the second plurality of pMOS transistors 230, 330 has a pMOS transistor drain, a pMOS transistor source, and a pMOS transistor gate 398, 598. Each pMOS transistor gate 398, 598 of the second plurality of pMOS transistors 230, 330 extends in the first direction and is coupled together. Each pMOS transistor source and each pMOS transistor drain of the second plurality of pMOS transistors 230, 330 is coupled to the first voltage source Vdd. Each pMOS transistor gate 398, 598 of the second plurality of pMOS transistors 230, 330 and a corresponding pMOS transistor gate 398, 598 of the first plurality of pMOS transistors 220, 320 are formed through a gate interconnect 398, 598 extending in the first direction.

In one configuration, the first metal interconnect 110, 210, 310, 510 is coupled to each pMOS transistor gate 398, 598 of the first and second plurality of pMOS transistors 220, 320, 230, 330 at one of the first end 112, 212, 312 or the at least one tap point 116, 216, 316 between the first end 112, 212, 312 and the second end 114, 214, 314. The first metal interconnect 110, 210, 310, 510 is coupled to the second voltage source Vss at an other of the first end 112, 212, 312 or the at least one tap point 116, 216, 316 between the first end 112, 212, 312 and the second end 114, 214, 314, and the first metal interconnect 110, 210, 310, 510 extends over the second plurality of pMOS transistors 230, 330.

In one configuration, the first end 112, 212, 312 is coupled to the pMOS transistor gates 398, 598 of the first plurality of pMOS transistors 220, 320 and the second plurality of pMOS transistors 230, 330, and the at least one tap point 116, 216, 316 is coupled to the second voltage source Vss. In one configuration, the second end 114, 214, 314 is unconnected.

In one configuration, a third plurality of pMOS transistors 240 is powered by the first voltage source Vdd. Each of the third plurality of pMOS transistors 240 has a pMOS transistor drain, a pMOS transistor source, and a pMOS transistor gate 398, 598. Each pMOS transistor gate 398, 598 of the third plurality of pMOS transistors 240 extends in the first direction and is coupled to other pMOS transistor gates 398, 598 of the third plurality of pMOS transistors 240. Each pMOS transistor source and each pMOS transistor drain of the third plurality of pMOS transistors 240 is coupled to the first voltage source Vdd. In such a configuration, a fourth plurality of pMOS transistors 250 is powered by the first voltage source Vdd. Each of the fourth plurality of pMOS transistors 250 has a pMOS transistor drain, a pMOS transistor source, and a pMOS transistor gate 398, 598. Each pMOS transistor gate 398, 598 of the fourth plurality of pMOS transistors 250 extends in the first direction and is coupled together. Each pMOS transistor source and each pMOS transistor drain of the fourth plurality of pMOS transistors 250 is coupled to the first voltage source Vdd. Each pMOS transistor gate 398, 598 of the fourth plurality of pMOS transistors 250 and a corresponding pMOS transistor gate 398, 598 of the third plurality of pMOS transistors 240 is formed through a gate interconnect 398, 598 extending in the first direction. In one configuration, the first metal interconnect 110, 210, 310, 510 is coupled to each pMOS transistor gate 398, 598 of the third and fourth plurality of pMOS transistors 240, 250 at one of the first end 112, 212, 312 or the at least one tap point 116, 216, 316 between the first end 112, 212, 312 and the second end 114, 214, 314, and the first metal interconnect 110, 210, 310, 510 extends over the third and fourth plurality of pMOS transistors 240, 250.

In one configuration, the first metal interconnect 110, 210, 310, 510 extends in substantially an "S" shape over the first plurality of pMOS transistors 220, 320 and the second plurality of pMOS transistors 230, 330.

In one configuration, the MOS IC decoupling capacitor 100, 200, 300, 400, 500, 550 further includes a second metal interconnect 270, 370, 570 extending in a second direction orthogonal to the first direction. The second metal interconnect 270, 370, 570 is coupled to each pMOS transistor source and each pMOS transistor drain of the first plurality of pMOS transistors 220, 320 and is coupled to the first voltage source Vdd. In such a configuration, the MOS IC decoupling capacitor 100, 200, 300, 400, 500, 550 further includes a third metal interconnect 276, 376, 576 extending in the second direction. The third metal interconnect 276, 376, 576 is coupled to each pMOS transistor source and each pMOS transistor drain of the second plurality of pMOS transistors 230, 330 and is coupled to the first voltage source Vdd. In one configuration, the first metal interconnect 110, 210, 310, 510, the second metal interconnect 270, 370, 570, and the third metal interconnect 276, 376, 576 are each formed by a different mask and are located on an M1 layer. In one configuration, the first metal interconnect 110, 210, 310, 510 extends in substantially an "S" shape over the first plurality of pMOS transistors 220, 320 and the second plurality of pMOS transistors 230, 330 and between the second metal interconnect 270, 370, 570 and the third metal interconnect 276, 376, 576. In one configuration, the second metal interconnect 270, 370, 570 and the third metal interconnect 276, 376, 576 include portions 272, 372, 278, 378 that extend in the first direction and that extend between portions of the substantially "S" shaped first metal interconnect 110, 210, 310, 510.

In one configuration, the first metal interconnect 110, 210, 310, 510 extends in one of the first direction or a second direction over the pMOS transistor sources of the first plurality of pMOS transistors 220, 320 and the second plurality of pMOS transistors 230, 330, and in an other of the first direction or the second direction over the pMOS transistor drains of the first plurality of pMOS transistors 220, 320 and the second plurality of pMOS transistors 230, 330, where the second direction is orthogonal to the first direction. In one configuration, the first metal interconnect 110, 210, 310, 510 extends in the first direction over the pMOS transistor sources of the first plurality of pMOS transistors 220, 320 and the second plurality of pMOS transistors 230, 330, and in the second direction over the pMOS transistor drains of the first plurality of pMOS transistors 220, 320 and the second plurality of pMOS transistors 230, 330.

In one configuration, the first plurality of pMOS transistors 220, 320 and the first metal interconnect 110, 210, 310, 510 are located in a gutter region 602 adjacent to one of a processor 604 or a controller 604 of the MOS IC decoupling capacitor 100, 200, 300, 400, 500, 550.

In one configuration, a MOS IC decoupling capacitor 100, 200, 300, 400, 500, 550 includes a first plurality of pMOS transistors 220, 320. Each pMOS transistor of the first plurality of pMOS transistors 220, 320 has a pMOS transistor drain, a pMOS transistor source, and a pMOS transistor gate 398, 598. Each pMOS transistor gate 398, 598 of the first plurality of pMOS transistors 220, 320 extends in a first direction and is coupled to other pMOS transistor gates 398, 598 of the first plurality of pMOS transistors 220, 320. Each pMOS transistor source and each pMOS transistor drain of the first plurality of pMOS transistors 220, 320 is coupled to a first voltage source Vdd. The MOS IC decoupling capacitor further includes means for propagating a signal (e.g., from a second voltage source Vss) extending over the first plurality of pMOS transistors 220, 320. The means for propagating the signal 110, 210, 310, 510 has a first end 112, 212, 312 and a second end 114, 214, 314. The means for propagating the signal 110, 210, 310, 510 is coupled to each pMOS transistor gate 398, 598 of the first plurality of pMOS transistors 220, 320 and is coupled to the second voltage source Vss less than the first voltage source Vdd. One of each pMOS transistor gate 398, 598 of the first plurality of pMOS transistors 220, 320 or the second voltage source Vss is coupled to the means for propagating the signal 110, 210, 310, 510 through at least one tap point 116, 216, 316 located between the first end 112, 212, 312 and the second end 114, 214, 314. The first plurality of pMOS transistors 220, 320 and the means for propagating the signal 110, 210, 310, 510 function as the decoupling capacitor. In one configuration, the means for propagating the signal is a first metal interconnect 110, 210, 310, 510.

As described supra, the exemplary decoupling capacitor 100, 200, 300, 400, 500, 550 includes a plurality of pMOS transistors powered by the voltage source Vdd and includes a resistor coupled to both the gates of the pMOS transistors and to the voltage source Vss. The resistor extends in substantially an "S" shape over the pMOS transistors. The decoupling capacitor is configured for programming a knee frequency through changing a location of a tap point of the resistor. The programming may be performed by changing one or more masks during fabrication of the IC.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) integrated circuit (IC), the MOS integrated circuit comprising:
 a first plurality of MOS transistors, each having a transistor drain, a transistor source, and a transistor gate, each transistor gate of the first plurality of MOS transistors extending in a first direction and being coupled to other transistor gates of the first plurality of MOS transistors, each transistor source and each transistor drain of the first plurality of MOS transistors being coupled to a first voltage source; and
 a first metal interconnect and a second metal interconnect extending over the first plurality of MOS transistors, the first metal interconnect having a first end and a second end, the first metal interconnect being coupled to each transistor gate of the first plurality of MOS transistors and being coupled to a second voltage source, one of each transistor gate of the first plurality of MOS transistors or the second voltage source being coupled to the first metal interconnect through at least one tap point located between the first end and the second end to adjust a resistance of the plurality of MOS transistors, the second metal interconnect being coupled to each transistor source and each transistor drain of the first plurality of MOS transistors, the second metal interconnect having portions that extend between portions of the first metal interconnect to increase a capacitance of the plurality of MOS transistors, the first plurality of MOS transistors functioning as a decoupling capacitor.

2. The MOS IC of claim 1, wherein the first metal interconnect extends in the first direction over the first plurality of MOS transistors, and in a second direction orthogonal to the first direction over the first plurality of MOS transistors.

3. The MOS IC of claim 1, further comprising a second plurality of MOS transistors, each having a transistor drain, a transistor source, and a transistor gate, each transistor gate of the second plurality of MOS transistors extending in the first direction and being coupled together, each transistor source and each transistor drain of the second plurality of MOS transistors being coupled to the first voltage source, each transistor gate of the second plurality of MOS transistors and a corresponding transistor gate of the first plurality of MOS transistors being formed through a gate interconnect extending in the first direction.

4. The MOS IC of claim 3, wherein the first metal interconnect is coupled to each transistor gate of the first and second plurality of MOS transistors at one of the first end or the at least one tap point between the first end and the second end, the first metal interconnect is coupled to the second voltage source at an other of the first end or the at least one tap point between the first end and the second end, and the first metal interconnect extends over the second plurality of MOS transistors.

5. The MOS IC of claim 4, wherein the first end is coupled to the transistor gates of the first plurality of MOS transistors and the second plurality of MOS transistors, and the at least one tap point is coupled to the second voltage source.

6. The MOS IC of claim 5, wherein the second end is unconnected.

7. The MOS IC of claim 4, further comprising:
a third plurality of MOS transistors, each having a transistor drain, a transistor source, and a transistor gate, each transistor gate of the third plurality of MOS transistors extending in the first direction and being coupled to other transistor gates of the third plurality of MOS transistors, each transistor source and each transistor drain of the third plurality of MOS transistors being coupled to the first voltage source; and
a fourth plurality of MOS transistors, each having a transistor drain, a transistor source, and a transistor gate, each transistor gate of the fourth plurality of MOS transistors extending in the first direction and being coupled together, each transistor source and each transistor drain of the fourth plurality of MOS transistors being coupled to the first voltage source, each transistor gate of the fourth plurality of MOS transistors and a corresponding transistor gate of the third plurality of MOS transistors being formed through a gate interconnect extending in the first direction, wherein the first metal interconnect is coupled to each transistor gate of the third and fourth plurality of MOS transistors at one of the first end or the at least one tap point between the first end and the second end, and the first metal interconnect extends over the third and fourth plurality of MOS transistors.

8. The MOS IC of claim 3, wherein the first metal interconnect extends in the first direction over the first plurality of MOS transistors and the second plurality of MOS transistors, and in a second direction orthogonal to the first direction, over the plurality of MOS transistors and the second plurality of MOS transistors.

9. The MOS IC of claim 3, further comprising:
the second metal interconnect extending in a second direction orthogonal to the first direction, the second metal interconnect being coupled to each transistor source and each transistor drain of the first plurality of MOS transistors and being coupled to the first voltage source; and
a third metal interconnect extending in the second direction, the third metal interconnect being coupled to each transistor source and each transistor drain of the second plurality of MOS transistors and being coupled to the first voltage source.

10. The MOS IC of claim 1, wherein the first metal interconnect and the second metal interconnect are located on a metal one (M1) layer.

11. The MOS IC of claim 9, wherein the first metal interconnect extends in the first direction, and in the second direction orthogonal to the first direction, over the first plurality of MOS transistors and the second plurality of MOS transistors and between the second metal interconnect and the third metal interconnect.

12. The MOS IC of claim 11, wherein the second metal interconnect and the third metal interconnect include portions that extend in the first direction and that extend between portions of the first metal interconnect that extend in the first direction.

13. The MOS IC of claim 3, wherein the first metal interconnect extends in one of the first direction or a second direction over the transistor sources of the first plurality of MOS transistors and the second plurality of MOS transistors, and in an other of the first direction or the second direction over the transistor drains of the first plurality of MOS transistors and the second plurality of MOS transistors, the second direction being orthogonal to the first direction.

14. The MOS IC of claim 13, wherein the first metal interconnect extends in the first direction over the transistor sources of the first plurality of MOS transistors and the second plurality of MOS transistors, and in the second direction over the transistor drains of the first plurality of MOS transistors and the second plurality of MOS transistors.

15. The MOS IC of claim 1, wherein the first plurality of MOS transistors and the first metal interconnect are located in a gutter region adjacent to one of a processor or a controller of the MOS IC.

16. The MOS IC of claim 1, wherein the first plurality of MOS transistors and the first metal interconnect function as a decoupling capacitor having a knee frequency that is a function of the at least one tap point.

17. A method of operation of a metal oxide semiconductor (MOS) integrated circuit (IC) decoupling capacitor, comprising:
powering a first plurality of MOS transistors by a first voltage source, each MOS transistor having a transistor drain, a transistor source, and a transistor gate, each transistor gate of the first plurality of MOS transistors extending in a first direction and being coupled to other transistor gates of the first plurality of MOS transistors, each transistor source and each transistor drain of the first plurality of MOS transistors being coupled to the first voltage source; and propagating a first signal through a first metal interconnect and a second signal through a second metal interconnect extending over the first plurality of MOS transistors, the first metal interconnect having a first end and a second end, the first metal interconnect being coupled to each transistor gate of the first plurality of MOS transistors and being coupled to a second voltage source, one of each transistor gate of the first plurality of MOS transistors or the second voltage source being coupled to the first metal interconnect through at least one tap point located between the first end and the second end to adjust a resistance of the plurality of MOS transistors, the second metal interconnect being coupled to each transistor source and each transistor drain of the first plurality of MOS transistors, the second metal interconnect having portions that extend between portions of the first metal interconnect to increase a capacitance of the plurality of MOS transistors, the first plurality of MOS transistors functioning as the decoupling capacitor.

18. The method of claim 17, wherein the first metal interconnect extends in the first direction over the first plurality of MOS transistors, and in a second direction orthogonal to the first direction over the first plurality of MOS transistors.

19. The method of claim 17, further comprising powering a second plurality of MOS transistors by the first voltage source, each having a transistor drain, a transistor source, and a transistor gate, each transistor gate of the second plurality of MOS transistors extending in the first direction and being coupled together, each transistor source and each transistor drain of the second plurality of MOS transistors being coupled to the first voltage source, each transistor gate of the second plurality of MOS transistors and a corresponding transistor gate of the first plurality of MOS transistors being formed through a gate interconnect extending in the first direction.

20. The method of claim 19, wherein the first metal interconnect is coupled to each transistor gate of the first and second plurality of MOS transistors at one of the first end or the at least one tap point between the first end and the second end, the first metal interconnect is coupled to the second voltage source at an other of the first end or the at least one tap point between the first end and the second end, and the first metal interconnect extends over the second plurality of MOS transistors.

21. The method of claim 20, wherein the first end is coupled to the transistor gates of the first plurality of MOS transistors and the second plurality of MOS transistors, and the at least one tap point is coupled to the second voltage source.

22. The method of claim 21, wherein the second end is unconnected.

23. A metal oxide semiconductor (MOS) integrated circuit (IC) decoupling capacitor, comprising:
a first plurality of MOS transistors with a first voltage source, each MOS transistor having a transistor drain, a transistor source, and a transistor gate, each transistor gate of the first plurality of MOS transistors extending in a first direction and being coupled to other transistor gates of the first plurality of MOS transistors, each transistor source and each transistor drain of the first plurality of MOS transistors being coupled to the first voltage source; and means for propagating a first signal and means for propagating a second signal extending over the first plurality of MOS transistors, the means for propagating the first signal having a first end and a second end, the means for propagating the first signal being coupled to each transistor gate of the first plurality of MOS transistors and being coupled to a second voltage source, one of each transistor gate of the first plurality of MOS transistors or the second voltage source being coupled to the means for propagating the first signal through at least one tap point located between the first end and the second end to adjust a resistance of the plurality of MOS transistors, the means for propagating the second signal being coupled to each transistor source and each transistor drain of the first plurality of MOS transistors, the means for propagating the second signal having portions that extend between portions of the means for propagating the first signal to increase a capacitance of the plurality of MOS transistors, the first plurality of MOS transistors functioning as the decoupling capacitor.

24. The MOS IC of claim 23, wherein the means for propagating the first signal is a first metal interconnect.

25. The MOS IC of claim 24, wherein the first metal interconnect extends in the first direction over the first plurality of MOS transistors, and in a second direction orthogonal to the first direction over the first plurality of MOS transistors.

26. The MOS IC of claim 24, further comprising a second plurality of MOS transistors, each having a transistor drain, a transistor source, and a transistor gate, each transistor gate of the second plurality of MOS transistors extending in the first direction and being coupled together, each transistor source and each transistor drain of the second plurality of MOS transistors being coupled to the first voltage source, each transistor gate of the second plurality of MOS transistors and a corresponding transistor gate of the first plurality of MOS transistors being formed through a gate interconnect extending in the first direction.

27. The MOS IC of claim 26, wherein the first metal interconnect is coupled to each transistor gate of the first and the second plurality of MOS transistors at one of the first end or the at least one tap point between the first end and the second end, the first metal interconnect is coupled to the second voltage source at an other of the first end or the at least one tap point between the first end and the second end, and the first metal interconnect extends over the second plurality of MOS transistors.

28. The MOS IC of claim 27, wherein the first end is coupled to the transistor gates of the first plurality of MOS transistors and the second plurality of MOS transistors, and the at least one tap point is coupled to the second voltage source.

29. The MOS IC of claim 28, wherein the second end is unconnected.

30. The MOS IC of claim 24, wherein the first plurality of MOS transistors and the first metal interconnect function as a decoupling capacitor having a knee frequency that is a function of the at least one tap point.

* * * * *